United States Patent [19]
McGinn

[11] Patent Number: 5,293,135
[45] Date of Patent: Mar. 8, 1994

[54] FM DEMODULATOR WITH SELF-TUNING QUADRATURE DETECTOR

[75] Inventor: Michael McGinn, Scottsdale, Ariz.
[73] Assignee: Motorola, Inc., Schaumburg, Ill.
[21] Appl. No.: 999,424
[22] Filed: Dec. 31, 1992
[51] Int. Cl.$^5$ .............................................. H03D 3/06
[52] U.S. Cl. .................................... 329/337; 455/214
[58] Field of Search ................. 329/336, 337; 455/214

[56] References Cited
U.S. PATENT DOCUMENTS
4,451,792  5/1984  Gay ..................................... 329/337

Primary Examiner—Siegfried H. Grimm
Attorney, Agent, or Firm—Robert D. Atkins

[57] ABSTRACT

A quadrature detector FM demodulates an intercarrier signal operating at an unknown frequency. An LC tank circuit develops a 90° phase shift across inputs of a multiplier. The output signal of the multiplier is amplified and fedback to control a reactance stage and adjust the reactive load at an input of the multiplier so as to maintain a predetermined phase relationship independent of the frequency of the intercarrier signal. A phase compensation stage removes any real component at the inputs of the multiplier also in response to the feedback signal.

17 Claims, 3 Drawing Sheets

FM DEMODULATOR WITH SELF-TUNING QUADRATURE DETECTOR

BACKGROUND OF THE INVENTION

The present invention relates in general to FM demodulators, and more particularly, to an FM demodulator with a self-tuning quadrature detector.

FM demodulators are commonly used in television receivers where a transmitted signal must be demodulated to extract the audio and video signals from the RF (radio frequency) carrier. In a simplified view, the video information is AM modulated on a video carrier $f_c$ and the audio information is FM modulated on a sound carrier $f_s$. The transmitted RF signal frequency is reduced through a tuner to an IF (intermediate frequency) signal and demodulated to baseband. After demodulation of the IF signal, the video information becomes a video baseband signal, while the audio information remains modulated on a sound intercarrier ($f_c$–$f_s$) at the difference between the video carrier $f_c$ and sound carrier $f_s$. In the United States, the video carrier $f_c$ is set to 45.75 MHz, and the sound carrier $f_s$ is set to 41.25 MHz, leaving the $f_c$–$f_s$ sound intercarrier at 4.5 MHz. The demodulated IF signal may be further processed through a trap (band-reject) filter to remove the $f_s$ sound carrier and retrieve the video information as luma (black and white) and chroma (color). An RGB signal may be generated from luma and chroma to drive the CRT screen. Likewise, the demodulated IF signal may be processed through a band-pass filter to isolate the sound intercarrier and then FM demodulated with a quadrature detector to retrieve the audio information.

One difficulty for FM demodulators in television receivers is the variety of carrier frequencies used worldwide for television signal transmission. There does not exist a single, worldwide television carrier frequency standard. In the audio processing path, the quadrature detector typically uses a fixed inductor-capacitor (LC) tank circuit tuned to produce a 90° phase shift between the inputs of a multiplier at a predetermined sound intercarrier frequency. Unfortunately, the sound intercarrier frequency may vary between say 4.5 MHz and 6.5 MHz depending on the country of operation. Therefore, the quadrature detector manufacturer must be aware of the importing country's standard in order to properly pre-tune the LC tank circuit. This customization adds costs to the commercial manufacturing and complicates the distribution process.

With the multi-frequency standards, a need exists for a quadrature detector capable of self-tuning over a range of frequencies in a well determined manner while improving linearity.

SUMMARY OF THE INVENTION

Briefly stated, the invention comprises a quadrature detector including a multiplier circuit first and second inputs receiving first and second input signals operating at a frequency. A first circuit has an output coupled to the second input of the multiplier at a first node for developing a reactive load to establish a predetermined phase relationship between the first and second input signals. A second circuit is coupled between the output of the multiplier and the first node for adjusting the reactive load to maintain the predetermined phase relationship as the frequency of the first and second input signals changes.

In another aspect, the present invention is a method of demodulating an input signal operating at a frequency comprising the steps of amplifying the input signal and providing first and second output signals, AC-coupling the second output signal for removing DC components and producing a predetermined phase shift between the first and second input signals while providing an AC-coupled output signal, multiplying the first output signal and the AC-coupled output signal for providing a multiplied signal, developing a reactive load to establish a predetermined phase relationship between first output signal and the AC-coupled output signal, and adjusting the reactive load to maintain the predetermined phase relationship as the frequency of the input signal changes.

DETAILED DESCRIPTION OF THE PREFERRED EMBODIMENT

Figure 1:
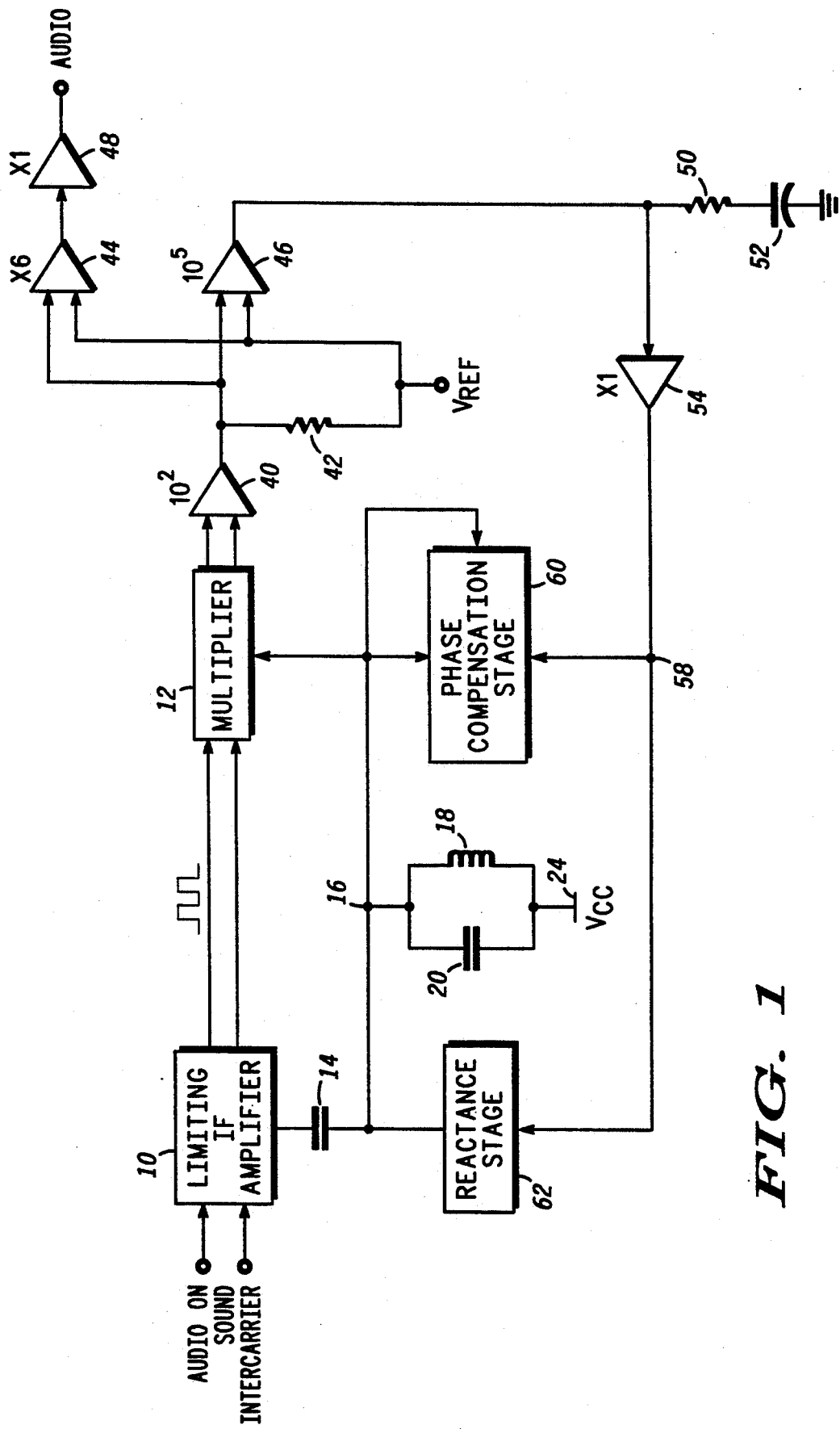
FIG. 1 is a simplified schematic and block diagram illustrating a quadrature detector.

Referring to FIG. 1, a sound intercarrier signal $f_c$–$f_s$ FM modulated with audio information is applied to limiting IF amplifier 10. The sound intercarrier may be sinusoidal operating at say 4.5 MHz with an input amplitude ranging between 100 μv and 100 mv RMS. Limiting IF amplifier 10 may comprise a series of differential amplifier stages (not shown) each with gain intended to square-up the sound intercarrier signal. The first output of amplifier 10 is differential and may be provided with a differential emitter-follower stage (not shown) after the last differential gain stage. The second output is level shifted down one diode on both sides of the differential emitter-follower stage for providing a 300 mv differential squarewave to multiplier 12. The first output of amplifier 10 is AC-coupled through capacitor 14 to an LC tank circuit at node 16 for providing an input to multiplier 12. Capacitor 14 may be selected at 5 pf. The LC tank circuit includes inductor 18 and capacitor 20 connected in parallel between node 16 and power supply conductor 24 operating at a positive potential $V_{CC}$ such as 5 VDC.

Figure 2:
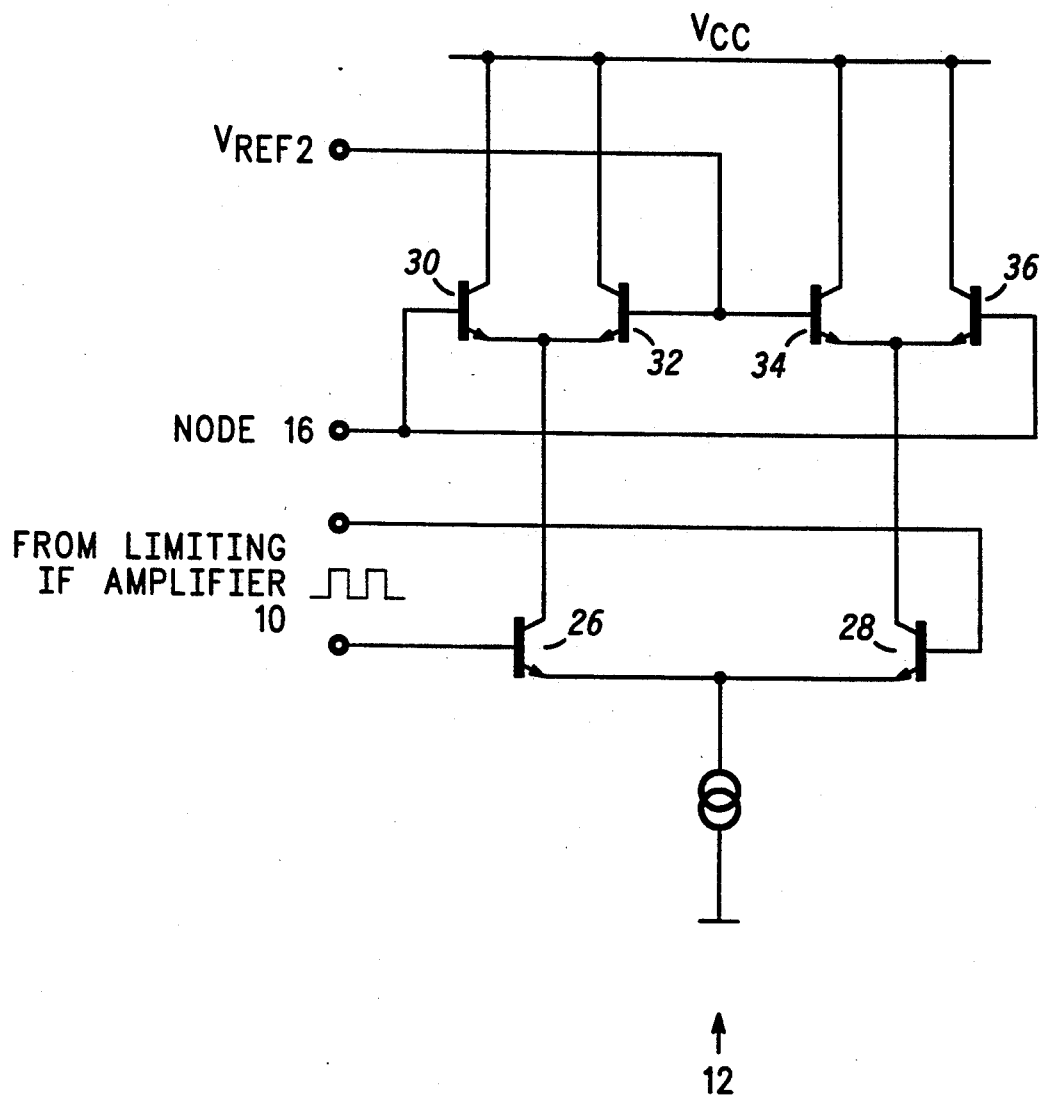
FIG. 2 is a schematic diagram illustrating the multiplier of FIG. 1.

Further detail of multiplier 12 is shown in FIG. 2 where transistors 26 and 28 receive the differential squarewave from the second output of amplifier 10. Transistors 30 and 36 receive the AC-coupled sinusoidal signal at their bases as shown, while transistors 32 and 34 receive a reference potential $V_{REF2}$. The combination of multiplier 12 and LC tank Circuit 18-20 operate as a quadrature detector for FM demodulating the audio information from the sound intercarrier signal. LC tank circuit 18-20 converts frequency variation to phase variation, while multiplier 12 converts the phase variation with frequency between its inputs to changes in output current. LC tank circuit 18-20 provides a 90° phase shift between the first output of amplifier 10 and node 16 at the center frequency of the sound intercarrier causing multiplier 12 to output substantially zero current in response to the sound intercarrier signal. Any output current from multiplier 12 is attributed to small frequency variation from the modulated audio signal. Thus, multiplier 12 removes the sound intercarrier leaving only the audio signal when LC tank circuit 18-20 is properly tuned to the frequency of the sound intercarrier signal.

One advantage of the present invention is the application of feedback to automatically self-tune LC tank circuit 18-20 to match the frequency of the sound intercarrier signal. This feature supports many transmission frequency standards for operation in most if not all countries, while maintaining good signal-to-noise ratio (SNR) and improving linearity by reducing the phase error between the inputs of multiplier 12.

Returning to FIG. 1, the differential output of multiplier 12 is increased by a factor of say $10^2$ through amplifier 40. Amplifier 40 outputs a current to develop a voltage across resistor 42 offset by a reference potential $V_{REF1}$ operating at 1.5 volts. Amplifier 44 amplifies the voltage developed across resistor 42 by a factor of say six, while amplifier 46 amplifies the same voltage by a factor of say $10^5$. The output of amplifier 44 is processed through unity-gain buffer amplifier 48 for providing the audio signal for generating sound in the television set. Resistor 50 and capacitor 52 provide a 20 Hz low-pass filter at the output of amplifier 46. Amplifier 46 drives the negative feedback loop through unity-gain buffer amplifier 54 to node 58. Phase compensation stage 60 and reactance stage 62 adjust the resistive and reactive impedance at node 16, and therefore the center frequency of LC tank circuit 18-20, to match the sound intercarrier frequency. The arrangement provides a small DC change at the audio output over the full tuning range, while a full 3.0 volt peak-to-peak audio signal is developed at the audio output due to the reduced loop gain above 20 Hz.

Figure 3:
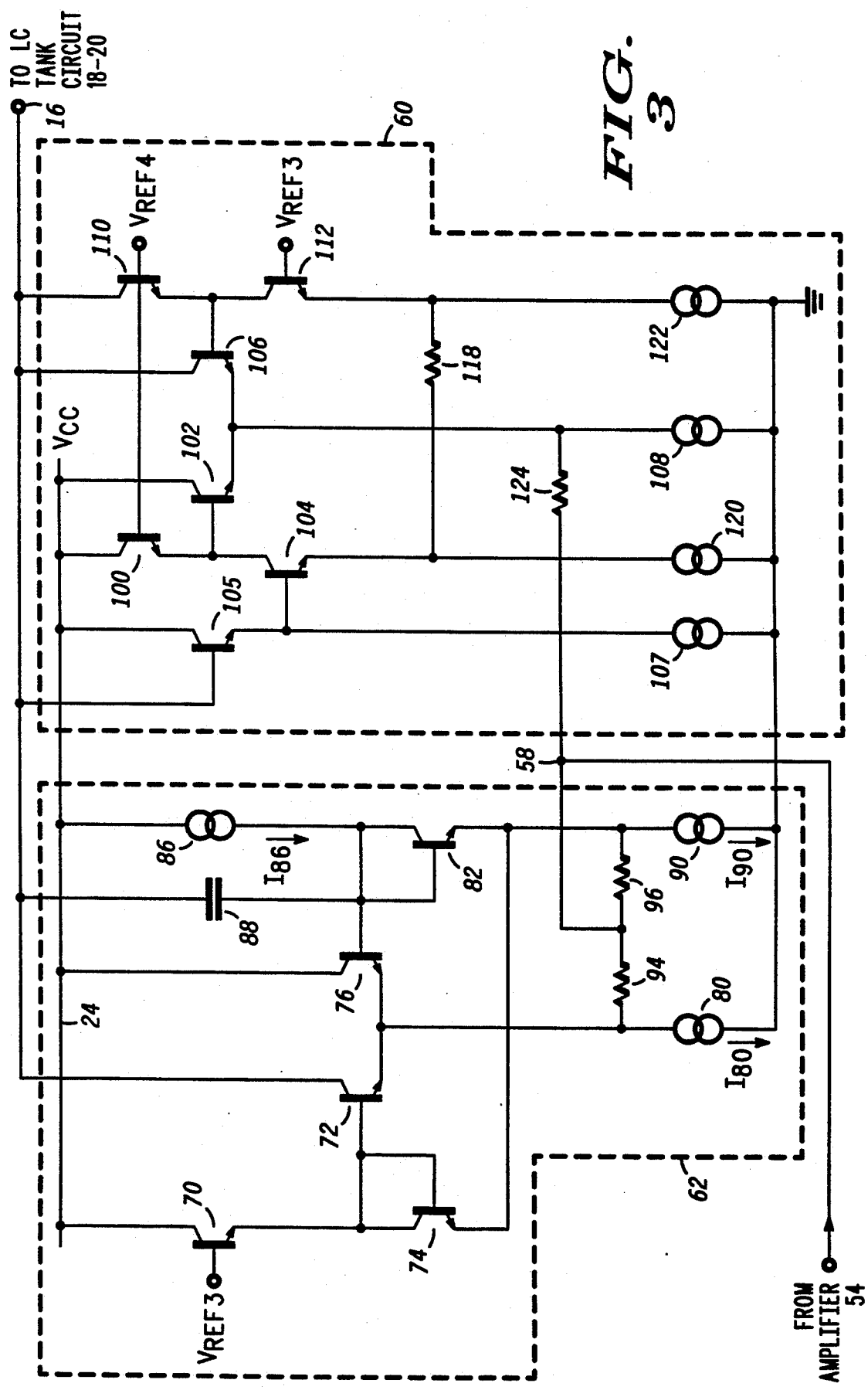
FIG. 3 is a schematic diagram illustrating the reactance stage and phase compensation stage of FIG. 1.

Phase compensation stage 60 and reactance stage 62 are shown in FIG. 3. Reactance stage 62 includes transistor 70 having a collector coupled to power supply conductor 24 operating at $V_{CC}$, and a base coupled for receiving a reference potential $V_{REF3}$ operating at 2.0 volts. The emitter of transistor 70 is coupled to the base of transistor 72 and to the collector and base of diode-configured transistor 74. Transistor 72 includes a collector coupled to node 16. The emitters of transistors 72 and 76 are coupled together to the output of current supply 80. Transistor 76 has its collector coupled to power supply conductor 24 and its base coupled to the collector and base of diode-configured transistor 82 at the output of current supply 86. Capacitor 88 is coupled between the collectors of transistors 72 and 82. The emitter of transistor 82 is coupled to the emitter of transistor 74 at the output of current supply 90. Resistors 94 and 96 are serially coupled between the outputs of current supplies 80 and 90 with their interconnection at node 58. Any current flowing through resistors 94 and 96 in reactance stage 62 creates an imbalance between the current flow through transistors 74 and 82 and the current flow through transistors 72 and 76. Resistor 94 may be selected at 3K ohms while resistor 96 is set to 20K ohms.

Phase compensation stage 60 includes transistor 100 having a collector coupled to power supply conductor 24 and a base coupled for receiving a reference potential $V_{REF4}$ operating at 3.0 volts. The emitter of transistor 100 is coupled to the base of transistor 102 and to the collector of transistor 104. The base of transistor 104 is coupled to node 16 by way of emitter-follower transistor 105. Transistor 102 includes a collector coupled to power supply conductor 24. The emitter of transistor 105 is coupled to the output of current supply 107, while the emitters of transistors 102 and 106 are coupled together to the output of current supply 108. Transistor 106 has its collector coupled to node 16 and its base coupled to the emitter of transistor 110 and to the collector of transistor 112. The collector of transistor 110 is coupled to node 16 while its base receives reference potential $V_{REF4}$. The base of transistor 112 receives reference potential $V_{REF3}$. Resistor 118 is coupled between the outputs of current supplies 120 and 122 at the emitters of transistors 104 and 112, respectively. Resistor 124 is coupled between node 58 and the common emitters of transistors 102 and 106.

The operation of reactance stage 62 proceeds as follows. Current supplies 80 and 90 are preset to conduct equal currents $I_{80}$ and $I_{90}$ of 0.5 milliamps, respectively, while current supply 86 is set to conduct a current $I_{86}$ equal to $I_{90}/2$. An AC current $I_C$ follows through capacitor 88 and transistor 82. Capacitor 88 may be selected at 18 pf. Assume the sound intercarrier frequency of 4.5 MHz matches the center frequency of the LC tank circuit based solely on the values of inductor 18 (15 mh) and capacitor 20 (56 pf). A 90° phase shift appears across the inputs of multiplier 12 and its output is substantially zero. Any output signal from multiplier 12 is attributed to the modulated audio signal on the sound intercarrier which amplifier 44 picks up as the audio output signal varying say 3.0 volts peak-to-peak.

Amplifiers 40 and 46 provide a large loop gain at DC, $10^2$ and $10^5$ respectively. However, the signal level from multiplier 12 is small and virtually no feedback signal passes through amplifier 54 because of a zero error between the mean sound intercarrier frequency and the uncompensated center frequency $f_T$ of LC tank circuit 18-20. Therefore, substantially no current flows through resistors 94 and 96 and consequently the current through transistors 72 and 76 is $-I_C$ and $I_C$, respectively. There is no net capacitive current $I_C$ flowing in LC tank circuit 18-20 by way of node 16. Reactance stage 62 has no effect on the center frequency of the LC tank circuit as no correction is necessary.

Now assume the sound intercarrier frequency decreases to say 4.0 MHz and thus no longer matches the uncompensated center frequency (4.5 MHz) of LC tank circuit 18-20. The intercarrier frequency may change, for example, if the television is relocated to a country having a different transmission standard. The phase shift across the inputs of multiplier 12 moves away from 90° and produces a non-zero signal at the output of multiplier 12. Amplifier 40 amplifies the output signal of multiplier 12 and sinks a current through resistor 42 to develop a voltage across the inputs of amplifier 46. A feedback signal appears at the output of amplifier 46. Higher frequency AC signals are shunted to ground by resistor 50 and capacitor 52, thereby attenuating the loop gain above 20 Hz. AC feedback signals less than 20 Hz pass through amplifier 54 for application to phase compensation stage 60 and reactance stage 62 as a voltage.

Assume the voltage at node 58 is increasing because of the mismatch between the sound intercarrier frequency $f_c-f_s$ and the uncompensated center frequency $f_T$ of LC tank circuit 18-20. The increasing voltage at node 58 causes unequal currents $I_{94}$ and $I_{96}$ to flow through resistors 94 and 96 into current sources 80 and 90, respectively. Recall that resistor 94 is less than resistor 96. More current flows though resistor 94 than resistor 96 and thus less current flows through transistors 72 and 76 than through transistors 74 and 82, respectively. With the structure as shown in FIG. 3, the ratio of AC/DC in transistors 74 and 82 is the same as the ratio of AC/DC in transistors 72 and 76. The AC component of the current through transistor 72 decreases, thereby changing the capacitive current flow into node 16. This effectively places a variable positive capacitance across LC tank circuit 18-20. The center frequency of LC tank circuit 18-20 moves to a higher frequency by virtue of the change in effective capacitance.

Conversely, if the sound intercarrier frequency is greater than the uncompensated center frequency of LC tank circuit 18-20, the voltage at node 58 decreases and unequal currents $I_{94} > I_{96}$ flow through resistors 94 and 96. However, resistors 94 and 96 now sink current away from current supplies 80 and 90 into node 58. Transistors 72 and 76 conduct more current than transistors 74 and 82 and the AC component of the current through transistor 72 increases. The net effect is an increase in the capacitive current flow into node 16, thereby effectively placing a variable negative capacitance across LC tank circuit 18-20. The center frequency of LC tank circuit 18-20 moves to a lower frequency by the change in effective capacitance.

Another key feature of the present invention is provided by phase compensation circuit 60 in correcting for any real AC signal components at node 16. It is important that the current flowing into node 16 is 90°, leading with respect to the voltage across LC tank circuit 18-20 in order to appear capacitive. Accordingly, phase compensation circuit 60 removes any real AC signal component from the current flowing into node 16 to ensure a purely reactive behavior.

The configuration and operation of phase compensation circuit 60 is analogous to that described for reactance stage 62. Again assume the voltage at node 58 is increasing because of the mismatch between the sound intercarrier frequency and the uncompensated center frequency of LC tank circuit 18-20. The signal at node 16 is buffered through emitter-follower transistor 104 and a voltage $V_T$ is developed across resistor 118 equal to the voltage across LC tank circuit 18-20. A current equal to $V_T/R_{118}$ flows through transistors 100 and 104, where $R_{118}$ is the value of resistor 118. A corresponding current equal to $-V_T/R_{118}$ follows through transistors 110 and 112. By defining a negative component of current as one which is opposite in phase with respect to voltage across LC tank circuit 18-20, and a positive component of current as one which is in-phase with respect to voltage across LC tank circuit 18-20, any negative component of the AC signal at node 16 is compensated for by an equal and opposite component of current supplied by way of transistors 110 and 112.

To control the gain of phase compensation stage 60, the increasing voltage at node 58 causes a current to flow though resistor 124 into current supply 108, thereby reducing the current flow through transistors 102 and 106. As with the structure of reactance stage 62, the ratio of AC/DC in transistors 102 and 106 is the same as the ratio of AC/DC in transistors 104 and 112. Thus, the real AC component of the current through transistor 106 decreases, thereby varying the positive resistive current drawn from node 16. Conversely, if the sound intercarrier frequency is higher than the uncompensated center frequency of LC tank circuit 18-20, the voltage at node 58 decreases and resistor 124 sinks current into node 58. The real AC component of the current through transistor 106 increases accordingly to draw more resistive current away from node 16.

Hence, reactance stage 62 handles the reactive component of the signals at node 16 to achieve substantially 90° phase shift across the inputs of multiplier 12 independent of the frequency of the sound intercarrier. Phase compensation stage 60 takes care of any real component at node 16 to ensure pure reactive behavior.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A quadrature detector, comprising:
   a multiplier circuit having first and second inputs and an output, said first and second inputs receiving first and second input signals operating at a frequency;
   first means having an output coupled to said second input of said multiplier at a first node for developing a reactive load to establish a predetermined phase relationship between said first and second input signals; and
   second means coupled between said output of said multiplier and said first node for adjusting said reactive load to maintain said predetermined phase relationship as said frequency of said first and second input signals changes.

2. The quadrature detector of claim 1 wherein said first means includes:
   a second capacitor coupled between said first node and a first power supply conductor; and
   a first inductor coupled between said first node and said first power supply conductor.

3. The quadrature detector of claim 2 further including:
   a first amplifier receiving a modulated input signal operating at a frequency and providing at first and second outputs said first and second input signals to said multiplier; and
   a first capacitor coupled between said second output of said first amplifier and said first node.

4. The quadrature detector of claim 3 wherein said second means includes:
   a second amplifier having an input and an output, said input being coupled to said output of said multiplier;
   a first resistor coupled between said output of said second amplifier and a first reference potential;
   a third amplifier having first and second inputs and an output, said first input being coupled to said output of said second amplifier, said second input receiving said first reference potential;
   a low pass filter coupled to said output of said third amplifier;
   a fourth amplifier coupled between said output of said third amplifier and a second node; and
   third means coupled between said first and second nodes for varying said reactive load on said first node.

5. The quadrature detector of claim 4 wherein said second means further includes fourth means coupled between said first and second nodes for canceling real components of said signal at said second input of said multiplier.

6. The quadrature detector of claim 4 wherein said third means includes:

a first transistor having a base, an emitter and a collector, said collector being coupled to said first node;

a second transistor having a base, an emitter and a collector, said collector being coupled to said first power supply conductor;

a third transistor having a base, an emitter and a collector, said collector being coupled to said first power supply conductor, said base receiving a second reference potential;

a fourth transistor having a base, an emitter and a collector, said collector and base being coupled to said base of said first transistor and to said emitter of said third transistor;

first current supply means having an output for providing a predetermined current;

a fifth transistor having a base, an emitter and a collector, said collector and base being coupled to said base of said second transistor and to said output of said first current supply means;

a third capacitor coupled between said first node and said collector of said fifth transistor;

second current supply means having an output coupled to said emitters of said first and second transistors for providing a predetermined current;

third current supply means having an output coupled to said emitters of said fourth and fifth transistors for providing a predetermined current;

a second resistor coupled between said second node and said output of said second current supply means; and a third resistor coupled between said second node and said output of said third current supply means.

7. The quadrature detector of claim 5 wherein said fourth means includes:

a first transistor having a base, an emitter and a collector, said collector being coupled to said first node;

a second transistor having a base, an emitter and a collector, said collector being coupled to said first power supply conductor;

a third transistor having a base, an emitter and a collector, said collector being coupled to said first power supply conductor, said base receiving a second reference potential;

a fourth transistor having a base, an emitter and a collector, said collector being coupled to said base of said second transistor and to said emitter of said third transistor;

a fifth transistor having a base, an emitter and a collector, said collector being coupled to said first power supply conductor, said emitter being coupled to said base of said fourth transistor, said base being coupled to said first node;

first current supply means having an output coupled to said emitter of said fifth transistor for providing a predetermined current;

second current supply means having an output coupled to said emitter of said fourth transistor for providing a predetermined current;

a sixth transistor having a base, an emitter and a collector, said collector being coupled to said first node, said base receiving said second reference potential;

a seventh transistor having a base, an emitter and a collector, said collector being coupled to said base of said first transistor and to said emitter of said sixth transistor, said base receiving a third reference potential;

a second resistor coupled between said emitters of said fourth and seventh transistors;

third current supply means having an output coupled to said emitters of said first and second transistors for providing a predetermined current;

fourth current supply means having an output coupled to said emitter of said seventh transistor for providing a predetermined current; and a third resistor coupled between said second node and said emitters of said first and second transistors.

8. The quadrature detector of claim 5 wherein further including:

a fifth amplifier having first and second inputs and an output, said first input being coupled to said output of said second amplifier, said second input receiving said first reference potential; and a sixth amplifier having an input coupled to said output of said fifth amplifier and having an output for providing an audio signal.

9. A quadrature detector, comprising:

a first amplifier receiving an input signal operating at a frequency and providing first and second output signals at first and second outputs respectively;

a multiplier circuit having first and second inputs and differential outputs, said first input receiving said first output signal from said first amplifier;

a first capacitor coupled between said second output of said first amplifier and a first node at said second input of said multiplier;

first means having an output coupled to said first node for developing a reactive load to establish a predetermined phase relationship between signals at said first and second inputs of said multiplier; and second means coupled between said differential outputs of said multiplier and said first node for adjusting said reactive load to maintain said predetermined phase relationship as said frequency of said input signal changes.

10. The quadrature detector of claim 9 wherein said first means includes:

a second capacitor coupled between said first node and a first power supply conductor; and a first inductor coupled between said first node and said first power supply conductor.

11. The quadrature detector of claim 10 wherein said second means includes:

a second amplifier having first and second inputs and an output, said first and second inputs being coupled to said differential outputs of said multiplier;

a first resistor coupled between said output of said second amplifier and a first reference potential;

a third amplifier having first and second inputs and an output, said first input being coupled to said output of said second amplifier, said second input receiving said first reference potential;

a low pass filter coupled to said output of said third amplifier;

a fourth amplifier coupled between said output of said third amplifier and a second node; and third means coupled between said first and second nodes for varying said reactive load on said first node.

12. The quadrature detector of claim 11 wherein said second means further includes fourth means coupled between said first and second nodes for canceling real components of said signal at said second input of said multiplier.

13. The quadrature detector of claim 11 wherein said third means includes:
   a first transistor having a base, an emitter and a collector, said collector being coupled to said first node;
   a second transistor having a base, an emitter and a collector, said collector being coupled to said first power supply conductor;
   a third transistor having a base, an emitter and a collector, said collector being coupled to said first power supply conductor, said base receiving a second reference potential;
   a fourth transistor having a base, an emitter and a collector, said collector and base being coupled to said base of said first transistor and to said emitter of said third transistor;
   first current supply means having an output for providing a predetermined current;
   a fifth transistor having a base, an emitter and a collector, said collector and base being coupled to said base of said second transistor and to said output of said first current supply means;
   a third capacitor coupled between said first node and said collector of said fifth transistor;
   second current supply means having an output coupled to said emitters of said first and second transistors for providing a predetermined current;
   third current supply means having an output coupled to said emitters of said fourth and fifth transistors for providing a predetermined current;
   a second resistor coupled between said second node and said output of said second current supply means; and
   a third resistor coupled between said second node and said output of said third current supply means.

14. The quadrature detector of claim 12 wherein said fourth means includes:
   a first transistor having a base, an emitter and a collector, said collector being coupled to said first node;
   a second transistor having a base, an emitter and a collector, said collector being coupled to said first power supply conductor;
   a third transistor having a base, an emitter and a collector, said collector being coupled to said first power supply conductor, said base receiving a second reference potential;
   a fourth transistor having a base, an emitter and a collector, said collector being coupled to said base of said second transistor and to said emitter of said third transistor;
   a fifth transistor having a base, an emitter and a collector, said collector being coupled to said first power supply conductor, said emitter being coupled to said base of said fourth transistor, said base being coupled to said first node;
   first current supply means having an output coupled to said emitter of said fifth transistor for providing a predetermined current;
   second current supply means having an output coupled to said emitter of said fourth transistor for providing a predetermined current;
   a sixth transistor having a base, an emitter and a collector, said collector being coupled to said first node, said base receiving said second reference potential;
   a seventh transistor having a base, an emitter and a collector, said collector being coupled to said base of said first transistor and to said emitter of said sixth transistor, said base receiving a third reference potential;
   a second resistor coupled between said emitters of said fourth and seventh transistors;
   third current supply means having an output coupled to said emitters of said first and second transistors for providing a predetermined current;
   fourth current supply means having an output coupled to said emitter of said seventh transistor for providing a predetermined current; and
   a third resistor coupled between said second node and said emitters of said first and second transistors.

15. The quadrature detector of claim 12 wherein further including:
   a fifth amplifier having first and second inputs and an output, said first input being coupled to said output of said second amplifier, said second input receiving said first reference potential; and
   a sixth amplifier having an input coupled to said output of said fifth amplifier and having an output for providing an audio signal.

16. A method of demodulating an input signal operating at a frequency, comprising the steps of:
   amplifying the input signal and providing first and second output signals;
   AC-coupling said second output signal for removing DC components and producing a predetermined phase shift between said first and second output signals while providing an AC-coupled output signal;
   multiplying said first output signal and said AC-coupled output signal for providing a multiplied signal;
   developing a reactive load to establish a predetermined phase relationship between said first output signal and said AC-coupled output signal; and
   adjusting said reactive load to maintain said predetermined phase relationship as said frequency of said input signal changes.

17. The method of claim 16 wherein said step of adjusting said reactive load includes the steps of:
   amplifying said multiplied signal for providing a output current;
   developing a voltage from said output current;
   amplifying said voltage developed by said output current for providing an amplified voltage;
   low-pass filtering said amplified voltage for providing a feedback signal; and
   varying said reactive load in response to said feedback signal.

* * * * *